United States Patent [19]
Maejima

[11] Patent Number: 5,696,509
[45] Date of Patent: Dec. 9, 1997

[54] DIGITAL TO ANALOG CONVERTER USING CAPACITORS AND SWITCHES FOR CHARGE DISTRIBUTION

[75] Inventor: Toshio Maejima, Hamamatsu, Japan

[73] Assignee: Yamaha Corporation, Hamamatsu, Japan

[21] Appl. No.: 687,837

[22] Filed: Jul. 26, 1996

[30] Foreign Application Priority Data

Jul. 27, 1995 [JP] Japan .................. 7-210985

[51] Int. Cl.[6] .................................. H03M 1/66
[52] U.S. Cl. .................. 341/150; 341/172; 341/144
[58] Field of Search ...................... 341/144, 150, 341/172

[56] References Cited

U.S. PATENT DOCUMENTS

| | | | |
|---|---|---|---|
| 4,896,156 | 1/1990 | Garverick | 341/143 |
| 4,908,624 | 3/1990 | Goto et al. | 341/172 |
| 4,999,634 | 3/1991 | Brazdrum et al. | 341/172 |
| 5,134,401 | 7/1992 | McCartney et al. | 341/143 |
| 5,159,341 | 10/1992 | McCarney et al. | 341/143 |
| 5,177,484 | 1/1993 | Bruckmann | 341/172 |
| 5,572,107 | 11/1996 | Koch et al. | 320/1 |
| 5,581,252 | 12/1996 | Thomas | 341/144 |

*Primary Examiner*—Jeffrey A. Gaffin
*Assistant Examiner*—Peguy JeanPierre
*Attorney, Agent, or Firm*—Loeb & Loeb LLP

[57] ABSTRACT

A D/A converter is formed of a combination of switches and capacitors. A voltage source supplies a plurality of different predetermined voltages corresponding, respectively, to different logical levels of bit data of input digital data. A first switch device is connected to the voltage source for selecting the different predetermined voltages. A first capacitor is connected to the voltage source by way of the first switch device, and charged by the different voltages selected by the first switch device. A second capacitor is connected to the first capacitor by way of a second switch device, for carrying out distribution of charge between the first and second capacitors. A charge-to-voltage converter circuit is associated with the second capacitor, for converting charge from the second capacitor to voltage. A clock signal generator circuit generates clock signals for selectively driving the first and second switch devices, in synchronism with the bit data of the input digital data.

9 Claims, 5 Drawing Sheets

DIGITAL TO ANALOG CONVERTER USING CAPACITORS AND SWITCHES FOR CHARGE DISTRIBUTION

BACKGROUND OF THE INVENTION

1. Field of the Invention

The present invention relates to a D/A converter for converting input digital data to corresponding analog data, and more particularly to a D/A converter which performs digital-to-analog conversion by combinations of capacitors and switches.

2. Prior Art

Conventional D/A converters are generally constructed by combinations of resistances and switches. The conventional D/A converters are categorized into a D/A converter of the R-2R type and a D/A converter of the resistance-ladder type. The D/A converter of the R-2R type is a combination of an R-2R circuit which produces voltage based on bit data of input digital data on the basis of a reference voltage, and a switch circuit. The D/A converter of the resistance-ladder type is a combination of a ladder resistance circuitry for dividing a reference voltage, and a switch circuit.

In the D/A converter of the R-2R type, the number of component elements of the converter is increased in proportion to the number of bits of input digital data. In the D/A converter of the resistance-ladder type, the number of component elements is increased in proportion to the square of the number of bits of input digital data. Accordingly, the size of the D/A converting section is disadvantageously large in a D/A converter of the multi-bit type.

SUMMARY OF THE INVENTION

Under the above stated background, it is an object of the invention to provide a D/A converter which does not require an increase in the number of circuit elements of the converter even if the number of bits of input digital data is increased.

Another object of the invention is to provide a D/A converter which can be simple in circuitry and small in circuit size.

To attain the above objects, the present invention provides a D/A converter comprising a voltage source for supplying a plurality of different predetermined voltages corresponding, respectively, to different logical levels of bit data of input digital data, a first switch device connected to the voltage source for selecting the different predetermined voltages, a first capacitor connected to the voltage source by way of the first switch device, the first capacitor being charged by the different voltages selected by the first switch device, a second switch device connected to the first capacitor, a second capacitor connected to the first capacitor by way of the second switch device, for carrying out distribution of charge between the first and second capacitors, a charge-to-voltage converter circuit associated with the second capacitor, for converting charge from the second capacitor to voltage, and a clock signal generator circuit for generating clock signals for selectively driving the first and second switch devices, in synchronism with the bit data of the input digital data.

Preferably, the first and second switch devices are CMOS transfer gates.

Also preferably, the D/A converter includes a sample-and-hold circuit connected to the charge-to-voltage-converter circuit, for sampling and holding output data from the charge-to-voltage converter circuit.

Preferably, the D/A converter includes a third switch device connected to the second capacitor, for shortcircuiting the second capacitor, and wherein the charge-to-voltage converter is connected to the second capacitor by way of the third switch device.

Preferably, the clock signal generator circuit generates clock signals for selectively driving the first to third switch devices in synchronism with the bit data of the input digital data serially transmitted in an order from LSB thereof.

More preferably, the clock signal generator circuit generates the clock signals in a manner such that the first capacitor is charged by the voltage source by way of the first switch device in accordance with a logical level of the bit data of the input digital data serially transmitted in the order from LSB thereof, the distribution of charge between the first and second capacitors takes place through turning-on of the second switch device at a time point between two adjacent charging operations of the first capacitor corresponding to two adjacent ones of the bit data, the charging and the distribution of charge being repeated until after MSB of the input digital data is input to the D/A converter, and the charge from the second capacitor is converted to voltage by the charge-to-voltage converter circuit.

In a preferred embodiment of the invention, the D/A converter comprises first and second voltage sources for supplying, respectively, first and second predetermined voltages corresponding, respectively, to different logical levels of bit data of input digital data, first and second switches connected, respectively, to the first and second voltage sources for selecting the different predetermined voltages, a first capacitor connected to the first and second voltage sources by way of the first and second switches, the first capacitor being charged by the first and second predetermined voltages selected by the first and second switches, a third switch connected to the first capacitor, a second capacitor connected to the first capacitor by way of the third switch, for carrying out distribution of charge between the first and second capacitors, a fourth switch connected to the second capacitor, for shortcircuiting the second capacitor, a charge-to-voltage converter circuit connected to the second capacitor by way of the fourth switch, for converting charge from the second capacitor to voltage, and a clock signal generator circuit for generating clock signals for selectively driving the first and second switch devices, in synchronism with the bit data of the input digital data serially transmitted in an order from LSB thereof, wherein the clock signal generator circuit generates the clock signals in a manner such that the first capacitor is charged by the voltage source by way of the first switch or the second switch in accordance with a logical level of the bit data of the input digital data serially transmitted in the order from LSB thereof, the distribution of charge between the first and second capacitors takes place through turning-on of the the third switch at a time point between two adjacent charging operations of the first capacitor corresponding to two adjacent ones of the bit data, the charging and the distribution of charge being repeated until after MSB of the input digital data is input to the D/A converter, and the charge from the second capacitor is converted to voltage by the charge-to-voltage converter circuit.

Thus, the D/S converting function of the D/A converter of the invention is realized by using other circuit elements than resistances, namely, switches and capacitors, preferably, transfer gates and capacitors. Therefore, the number of circuit elements of the converter need not be increased even if the D/A converter is designed to convert input digital data of an increased number of bits. Further, the D/A converter can be simple in circuitry and small in circuit size.

DETAILED DESCRIPTION

The invention will now be described in detail with reference to the accompanying drawings showing a preferred embodiment thereof.

Figure 1:
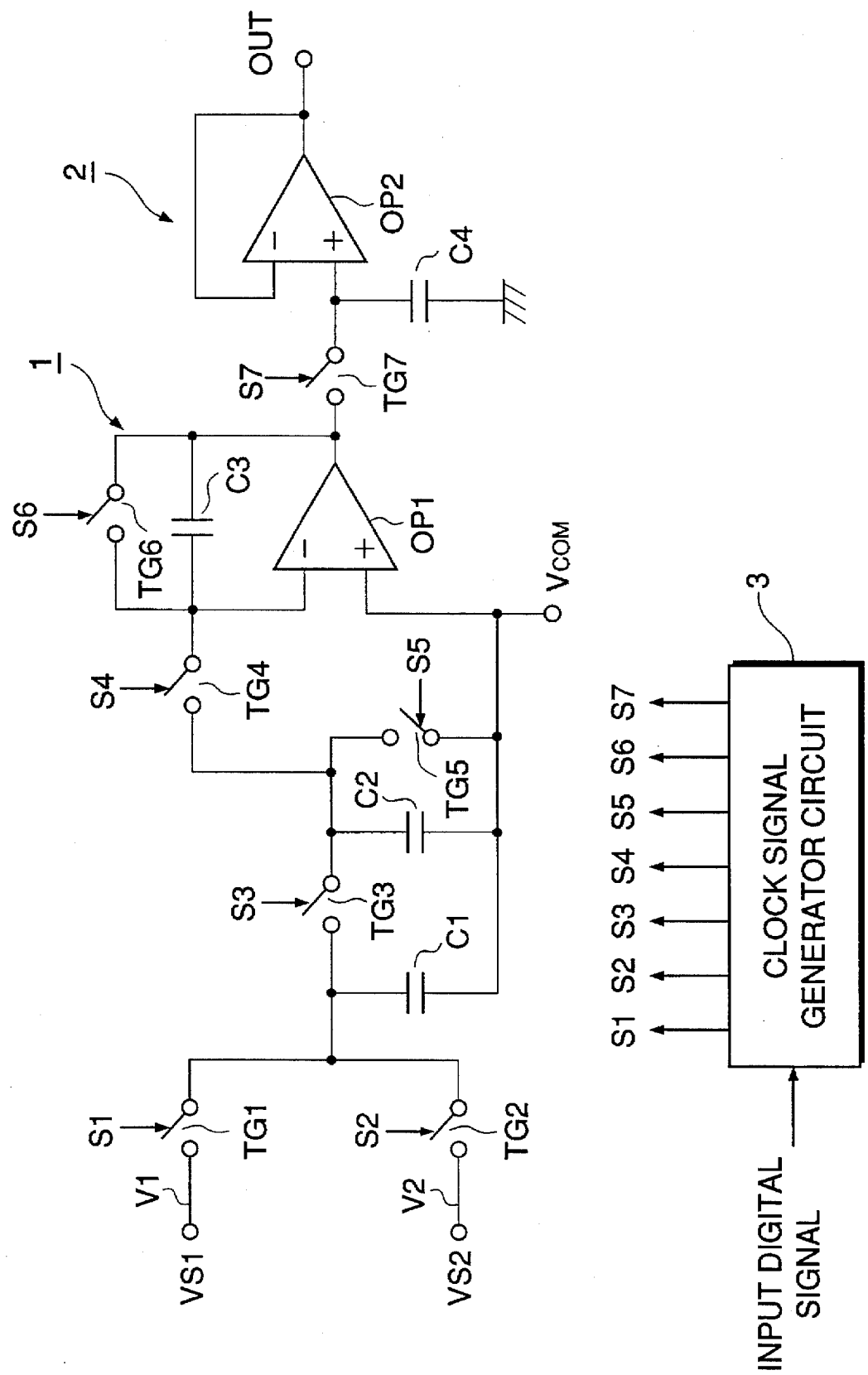
FIG. 1 is a circuit diagram showing the arrangement of a D/A converter according to an embodiment of the invention.

Referring first to FIG. 1, there is shown the arrangement of a D/A converter according to a preferred embodiment of the invention. As shown in the figure, the D/A converter has two voltage sources, i.e. a first voltage source Vs1 and a second voltage source Vs2, for handling two states "1" and "0" of input digital data, respectively. The first and the second voltage sources Vs1 and Vs2 are constant voltage sources which produce predetermined voltage V1 and predetermined voltage V2, respectively, where V1>V2 holds. Connected to the first and the second voltage sources Vs1 and Vs2 are first and second transfer gates (switches) TG1 and TG2, respectively. The outputs of the first and the second transfer gates TG1 and TG2 are connected together and then to a first capacitor C1. The first and the second transfer gates TG1 and TG2 are alternatively operated in synchronism with the bits of input digital data in a manner that the first transfer gate TG1 is turned on when bit data is "0", and the second transfer gate TG2 is turned on when bit data is "1". The digital data are serially transmitted in the order from the LSB to the MSB as will be described later. Thus, the first capacitor C1 is charged by the first voltage source Vs1 when bit data is "0", and by the second voltage source Vs2 when it is "1".

A reference potential VCOM is applied to a first or reference terminal of the first capacitor C1. The reference potential VCOM is a medium potential between the voltage V1 and the voltage V2 of the first and the second voltage sources Vs1 and Vs2. Connected to a second terminal of the first capacitor C1 is a second terminal of a second capacitor C2 by way of a third transfer gate (switch) TG3. A first or reference terminal of the second capacitor C2 also receives the reference potential VCOM. In other words, the reference terminals of the first and the second capacitors C1 and C2 are interconnected. When the third transfer gate TG3 is turned on, the second capacitor C2 receives charge from the first capacitor C1 for charge distribution between the capacitors C1 and C2. In the embodiment, the capacitance of the second capacitor C2 is equal to that of the first capacitor. The first capacitor C1 is successively charged by incoming bit data. At a time point between two adjacent charging operations of the first capacitor C1, the third transfer gate TG3 is turned on. In this state, charge flows into the second capacitor C2 from the first capacitor C1, to thereby effect charge distribution. A fifth transfer gate TG5 (switch) is connected across the second capacitor C2. The gate TG5 is provided for initializing the second capacitor C2 in the initial stage of the D/A converting operation. To initialize, the fifth transfer gate TG5 is turned on to electrically shortcircuit the second capacitor C2 to fully discharge the capacitor C2.

Connected to the second terminal of the second capacitor C2 through a fourth transfer gate (switch) TG4 is a charge-to-voltage converter circuit 1, which is formed of an operational amplifier OP1, a sixth transfer gate (switch) TG6, and a feedback capacitor C3. The circuit 1 serves also as an impedance-converting circuit. The fourth transfer gate TG4 is turned on after completion of each D/A converting operation, namely, after completion of the charging operation of the first and the second capacitor C1 and C2 and charge distribution between the first and second capacitors. Then, the charge-to-voltage converter circuit 1 produces a corresponding analog voltage at an output thereof. The sixth transfer data TG6 is connected across the feedback capacitor C3. To initialize the feedback capacitor C3 or the circuit 1, the sixth transfer gate TG6 is turned on to shortcircuit the feedback capacitor C3.

Connected to the output of the charge-to voltage converter circuit 1 is a sample-and-hold circuit 2, which is formed of a seventh transfer gate (switch) TG7, a fourth capacitor C4, and an operational amplifier OP2.

In the present embodiment, bidirectional transfer gates are used for the first to the seventh transfer gates TG1 to TG7. Control clock signals S1 to S7 to be applied to the transfer gates TG1 to TG7 are generated by a clock signal generator circuit 3, in synchronism with the input digital data supplied in the order from the LSB.

The timing and logic for generating the control clock signals S1 to S7 by the clock signal generator circuit 3 will be described. A control clock signal S1 or S2 is generated in accordance with the value of "0" or "1" of each data bit. A control clock signal S3 is generated at a mid time point between two adjacent charging operations by two successive bit data. The operations of these signals described so far form a basic operation of the D/A conversion.

After repeating the basic operation, a control clock signal S4 is generated to operate the charge-to-voltage converter circuit 1. A control clock signal S6 for initializing the charge-to-voltage converter circuit 1 is generated at a proper time point before the generation of the control clock signal S4. After the charge-to-voltage converter circuit 1 produces an analog signal, control clock signals S7 and S5 are generated so that the output analog signal is sampled and held by the clock signal S7, and the second capacitor C2 is initialized by the clock signal S5.

Figure 2A:
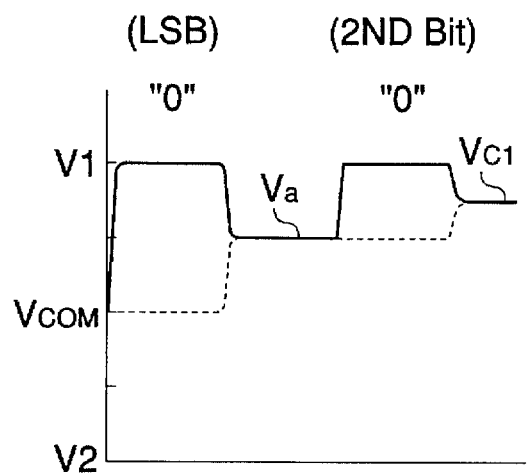
FIGS. 2A to 2D are diagrams useful in explaining a basic operation of the D/A converter of FIG. 1.
Figure 2B:
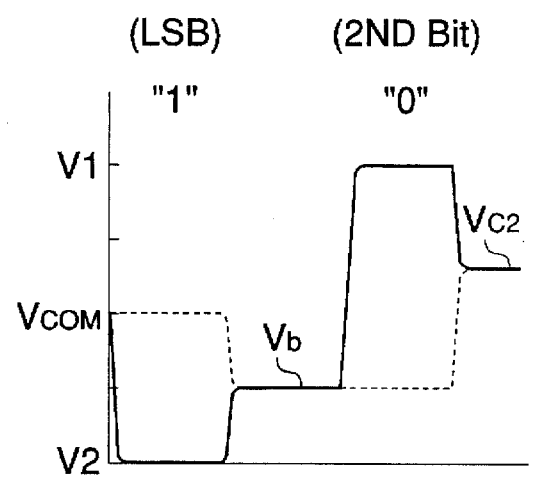
Figure 2C:
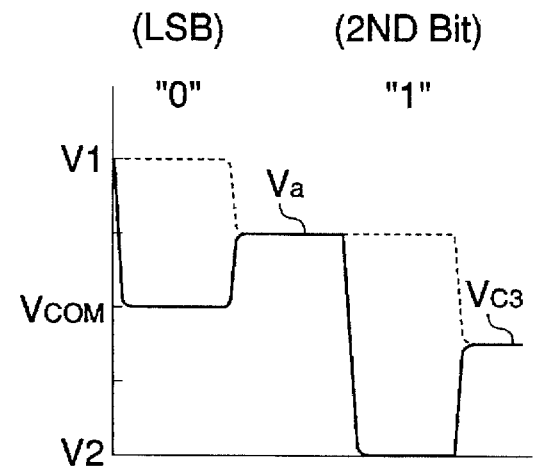
Figure 2D:
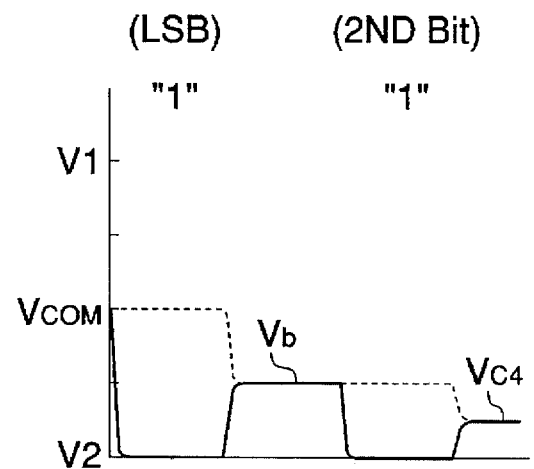

The D/A converting operation of the D/A converter constructed as above will be described with reference to FIGS. 2A to 2D. In the description to follow, let it be assumed that input digital data is 2-bit data, and four different 2-bit data, which are respectively defined by four combinations of data values, will be converted into analog data. The four combinations of the data values are: LSB (of the data) ="0" and 2nd bit="0" (FIG. 2A); LSB="1" and 2nd bit="0" (FIG. 2B); LSB="0" and 2nd bit="1" (FIG. 2C); LSB="1" and 2nd bit="1" (FIG. 2D). Waveforms shown in FIGS. 2A to 2D indicate voltage variations when the first capacitor C1 is charged, and then when charge is distributed from the first capacitor C1 into the second-capacitor C2 in the respective four combinations of the 2-bit data. As described above, if LSB="0", a charge C1 (V1−VCOM) is charged into the first capacitor C1. If LSB="1'" a charge C1 (V2−VCOM) is charged into the first capacitor C1. Then, the third transfer gate TG3 is turned on to close a loop of the first and the second capacitors C1 and C2. Charge flows or is distributed from the first capacitor C1 to the second capacitor C2. In this embodiment, C1=C2, and then if LSB="0", Va=(V1+VCOM)/2 appears across the second capacitor C2. If LSB="1", Vb=(V2+VCOM)/2 appears across the second capacitor C2.

Subsequently, the third transfer gate TG3 is turned off, and then the second bit data arrives at the D/A converter. Similarly, the first capacitor C1 is charged in accordance with the value, "0" or "1", of the second bit. The third transfer gate TG3 is turned on, so that the charge flows from the first capacitor C1 to the second capacitor C2. As a result, any of the following voltage appears across the second capacitor C2: Vc1=(V1+Va)/2 for the input data defined by LSB="0" and 2nd bit="0" (FIG. 2A); Vc2=(V1+Vb)/2 for the input data by LSB="1" and 2nd bit="0" (FIG. 2B); Vc3=(Va+V2)/2 for the data by LSB="0" and 2nd bit="1" (FIG. 2C); and Vc4=(Vb+V2)/2 for the data by LSB="1" and 2nd bit="1" (FIG. 2D). Thus, any of the voltages Vc1, Vc2, Vc3 and Vc4 appears across the second capacitor C2 in accordance with the input digital data value. A relationship between these voltages is Vc1>Vc2>Vc3>Vc4.

This relationship between the voltages produced after the final charge distribution is also valid for the D/A converting operation of digital data of 3 bits or more. Accordingly, digital data of 3 bits or more may be converted into analog data in a similar way.

Figure 3:
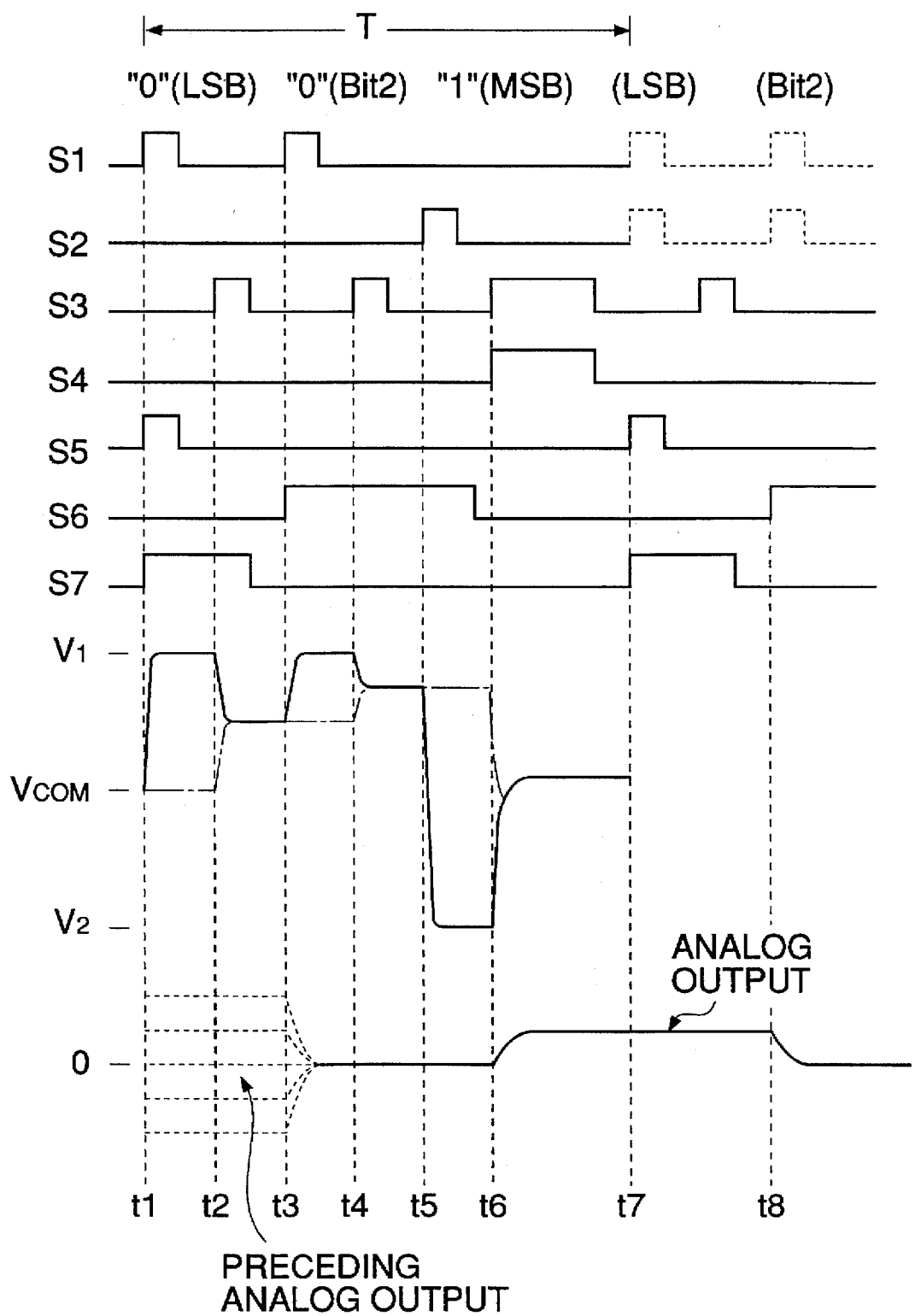
FIG. 3 is a timing chart showing an example of D/A converting operation of the D/A/converter of FIG. 1.

The D/A converting operation of the D/A converter when it converts input digital data of 3 bits into analog data will be described with reference to FIG. 3. The digital data to be converted is constructed such that the LSB of the data is "0", the second bit is "0", and the MSB is "1". When the LSB data, "0", is input to the D/A converter, the clock signal generator circuit 3 detects the value "0" of the input digital data, and produces a control clock signal S1 of a high level "H". The control clock signal S1 drives the first transfer gate TG1 to turn it on. In turn, the first voltage source Vs1 charges the first capacitor C1 (time point t1). At the time point t1, the clock signal generator circuit 3 also generates control signals S5 and S7 of "H". In response to the clock signals, the fifth transfer gate TG5 is turned on, while at the same time the seventh transfer gate TG7 is turned on. As a result, the second capacitor C2 is initialized, while the preceding data is sampled and held in the sample-and-hold circuit 2.

At a time point t2, a control signal S3 goes high in level and turns on the third transfer gate TG3. The charge flows from the first capacitor C1 into the second capacitor C2 (charge distribution). Then, a control clock signal S6 also goes high to turn on the sixth transfer gate TG6 of the charge-to-voltage converter circuit 1. As a result, the feedback capacitor C3 in the charge-to-voltage converter circuit 1 is initialized.

Then, the second bit "0" of the input digital data arrives at the D/A converter. As in the previous operation, the control clock signal S1 goes high, and the first capacitor C1 is charged by the first voltage source Vs1 (time point t3). Subsequently, the control clock signal S3 goes high, so that the charge distribution is performed (time point t4).

When the third bit or MSB "1" arrives threat, the control clock signal S2 goes high (time point t5) and the second capacitor C2 is charged by the second voltage source Vs2. Subsequently, the control clock signal S3 goes high, and charge distribution is performed (time point t6).

Simultaneously with the charge distribution on the MSB data, the control clock signal S4 goes high to turn on the fourth transfer gate TG4. The charge-to-voltage converter circuit 1 then operates to convert the amount of charge received into a corresponding analog voltage and produces the analog voltage while the first and second capacitors C1 and C2 are kept connected together. Thereafter, the control clock signal S7 is turned on at a time point t7, so that the analog voltage is transferred to and retained in the fourth capacitor C4 of the sample-and-hold circuit 2, and output in a voltage follower manner.

At the start of the sample/hold operation, the control clock signal S5 goes high to turn on the fifth transfer gate TG5. As a result, the second capacitor C2 is discharged, and the next D/A converting operation starts.

Figure 4:
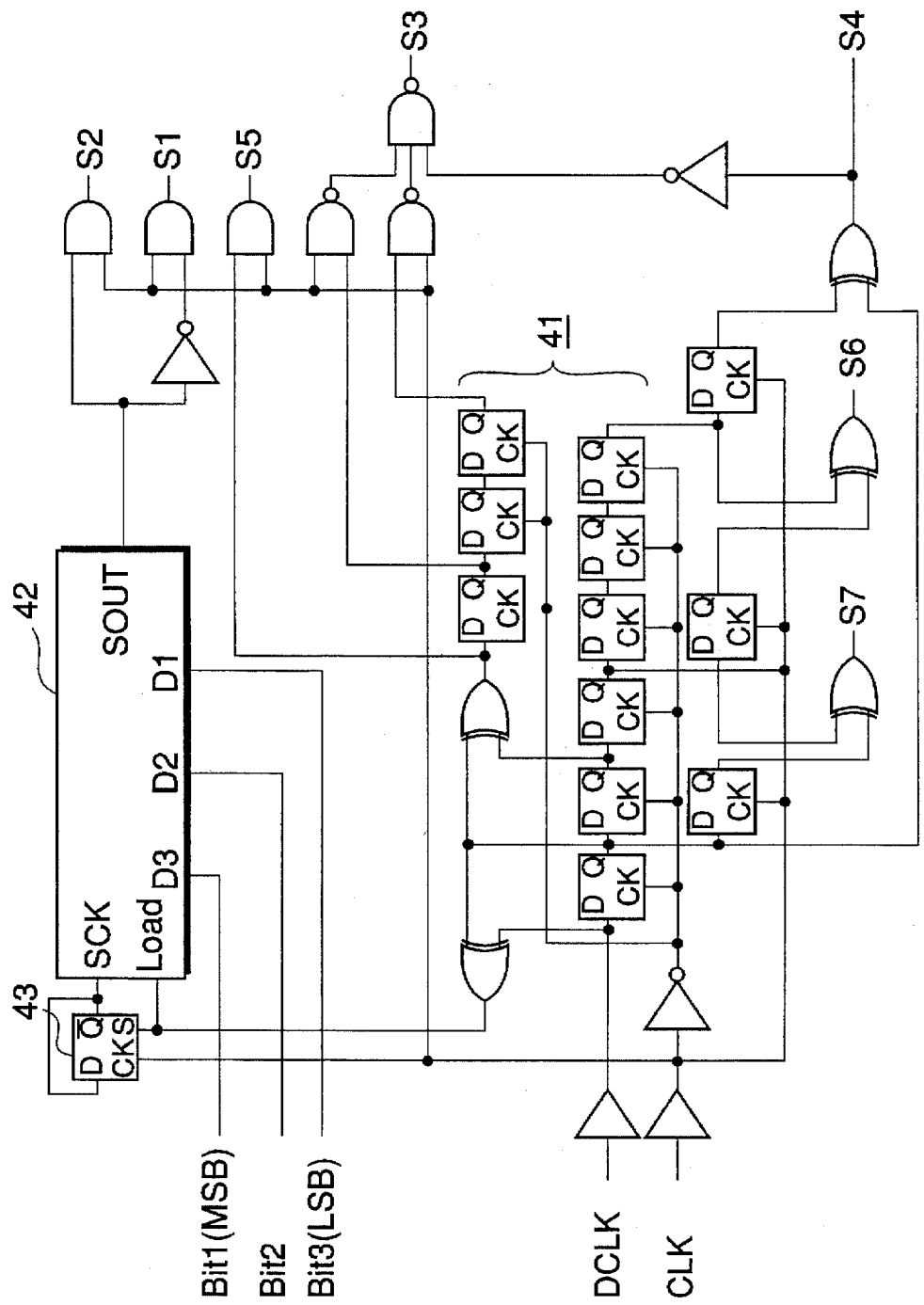
FIG. 4 is a circuit diagram showing the configuration of a clock signal generator used in the D/A converter of FIG. 1.
Figure 5:
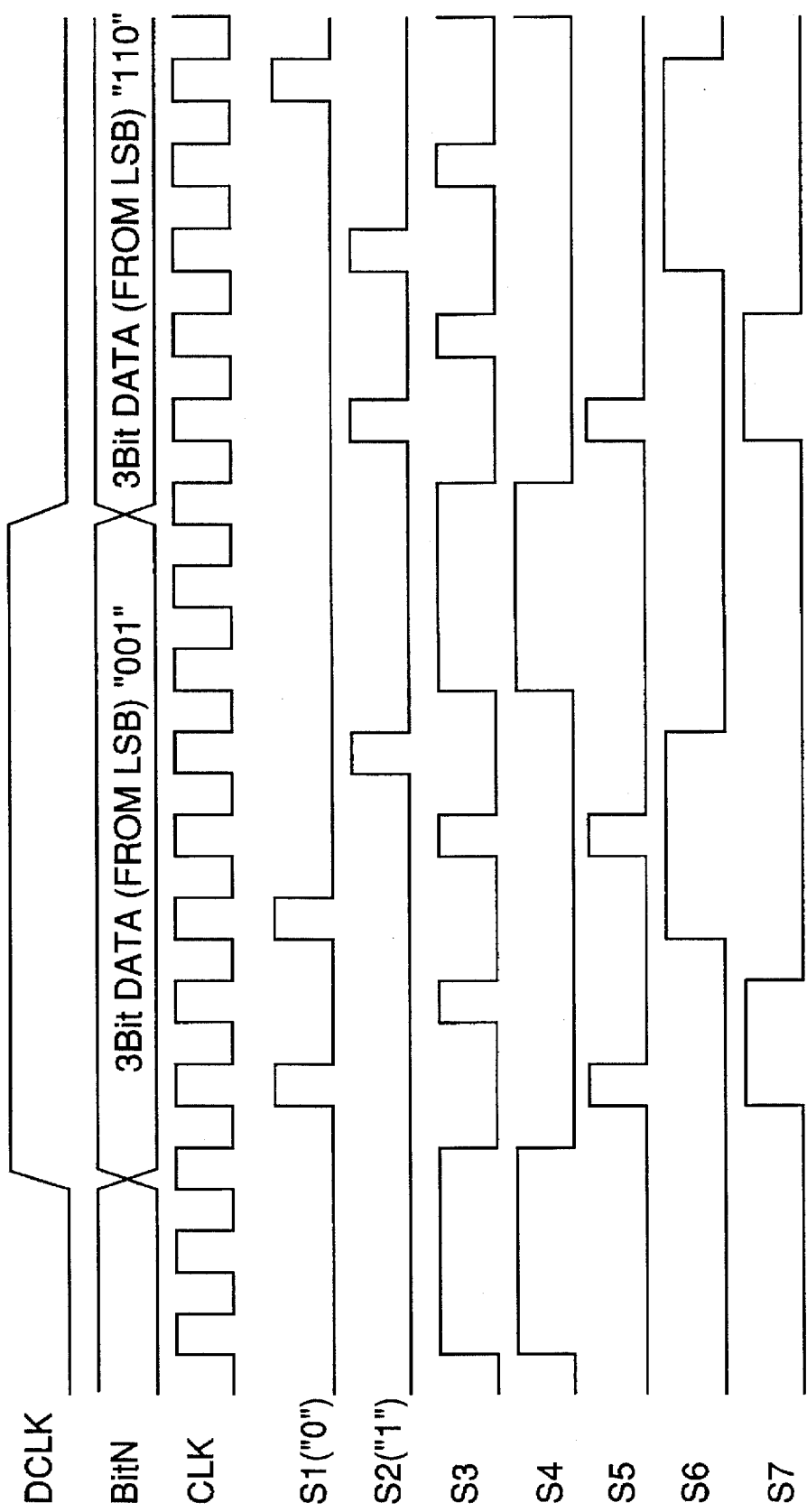
FIG. 5 is a timing chart showing the operation of the clock signal generator shown in FIG. 4.

The arrangement and operation of the clock signal generator circuit 3, which generates the control clock signals S1 to S7 as described above, will be described in detail with reference to FIGS. 4 and 5. The clock signal generator circuit 3 includes a timing circuit 41, which mainly includes D-type flip-flops, generates various timing signals on the basis of a basic clock signal CLK and a data clock signal DCLK having a repetition period equal to eight periods of the basic clock signal CLK, and generates control signals S1 to S7 of predetermined widths at predetermined timings during the periods of the data clock signal DCLK, independently of whether the digital data is "0" or "1", according to logical combinations of the generated timing signals.

The clock signal generator circuit 3 further includes a shift register 42 for making a serial-to-parallel conversion of bit data, and a ½ frequency demultiplier 43, which includes a D-type flip-flop, for generating a shift clock signal SCK on the basis of the basic clock signal CLK. Data bits Bit 1 to Bit 3 of the input digital data are loaded in parallel into the shift register 42 at the timing of generation of a load control signal, which is generated at a status changing point of the data clock signal DCLK. Incidentally, when the input digital data is serial data, it is converted into parallel data and then loaded into the shift register 42. The shift register 42 converts the parallel data into serial data in the order from the LSB thereof to the MSB at the timings of generation of the shift clock signal SCK, which is derived from the ½ frequency demultiplier 43 initialized by the load control signal. The data output from the shift register 42 and the basic clock signal CLK are logically processed to generate control clock signals S1 and S2 of which the logic states vary between "H" and "L" in accordance with the bit data values "0" and "1".

As seen from the foregoing description, according to the present invention, a novel and unique D/A converter is arranged by uniquely combining the transfer gates and the capacitors. When the number of bits forming the input digital data is increased, the period T in the timing chart shown in FIG. 3 is varied to a longer period, but the circuit arrangement of FIG. 1 remains unchanged and the number of circuit elements is not increased. Further, it should be noted that no resistance is used for D/A converting operation in the D/A converter of the invention, which simplifies the circuitry of the converter and enables forming the same of an integrated circuit compact in circuit size.

In the present invention, the reference potential VCOM applied to the reference terminals of the first and second capacitors in the charge-to-voltage converting circuitry may be a zero potential. In fabricating the D/A converter of an integrated circuit, however, it is preferable to set the reference potential VCOM at the medium potential of the power source voltage to use it as an operating point of the operational amplifier OP1 in the charge-to-voltage converting circuit. The voltages V1 and V2 of the first and the second voltage sources Vs1 and Vs2 may be properly selected within the range of the voltage of the power source used. In this case, it is more advantageous that the difference of each selected voltage V1, V2 from the reference potential VCOM is larger, because the maximum amount of charge that can be stored in the first and second capacitors C1, C2 is larger as the difference is larger. In other words, to design the D/A converter of the invention, it is necessary that the maximum amount of charge that can be stored should be sufficiently larger than $2^n$ where n is the number of bits of the input digital data. In this respect, the number of data bits that can be D/A converted is limited by the voltages of the voltage sources.

As described above, the present invention uniquely combines switches and capacitors to carry out charging of one of the capacitors and charge distribution from the one capacitor to the other capacitor to thereby perform D/A conversion. The resultant D/A converter has advantageous effects that the number of circuit elements of the converter is not increased even if the D/A converter is designed to convert input digital data of an increased number of bits to analog data, and that the D/A converter is simple in circuitry and small in circuit size.

What is claimed is:

1. A D/A converter comprising:

a voltage source for supplying a plurality of different predetermined voltages corresponding, respectively, to different logical levels of bit data of input digital data, a first switch device connected to said voltage source for selecting said different predetermined voltages;

a first capacitor connected to said voltage source by way of said first switch device, said first capacitor being charged by said different voltages selected by said first switch device;

a second switch device connected to said first capacitor;

a second capacitor connected to said first capacitor by way of said second switch device, for carrying out distribution of charge between said first and second capacitors;

a charge-to-voltage converter circuit associated with said second capacitor, for converting charge from said second capacitor to voltage; and a clock signal generator circuit for generating clock signals for selectively driving said first and second switch devices, in synchronism with said bit data of said input digital data.

2. A D/A converter as claimed in claim 1, wherein said first and second switch devices are CMOS transfer gates.

3. A D/A converter as claimed in claim 1, including a sample-and-hold circuit connected to said charge-to-voltage-converter circuit, for sampling and holding output data from said charge-to-voltage converter circuit.

4. A D/A converter as claimed in claim 1, including a third switch device connected to said second capacitor, for short-circuiting said second capacitor, and wherein said charge-to-voltage converter is connected to said second capacitor by way of said third switch device.

5. A D/A converter as claimed in claim 4, wherein said clock signal generator circuit generates clock signals for selectively driving said first to third switch devices in synchronism with said bit data of said input digital data serially transmitted in an order from LSB thereof.

6. A D/A converter as claimed in claim 5, wherein said clock signal generator circuit generates said clock signals in a manner such that said first capacitor is charged by said Voltage source by way of said first switch device in accordance with a logical level of said bit data of said input digital data serially transmitted in said order from LSB thereof, said distribution of charge between said first and second capacitors takes place through turning-on of said second switch device at a time point between two adjacent charging operations of said first capacitor corresponding to two adjacent ones of said bit data, said charging and said distribution of charge being repeated until after MSB of said input digital data is input to said D/A converter, and said charge from said second capacitor is converted to voltage by said charge-to-voltage converter circuit.

7. A D/A converter comprising:

first and second voltage sources for supplying, respectively, first and second predetermined voltages corresponding, respectively, to different logical levels of bit data of input digital data;

first and second switches connected, respectively, to said first and second voltage sources for selecting said different predetermined voltages;

a first capacitor connected to said first and second voltage sources by way of said first and second switches, said first capacitor being charged by said first and second predetermined voltages selected by said first and second switches;

a third switch connected to said first capacitor;

a second capacitor connected to said first capacitor by way of said third switch, for carrying out distribution of charge between said first and second capacitors;

a fourth switch connected to said second capacitor, for shortcircuiting said second capacitor;

a charge-to-voltage converter circuit connected to said second capacitor by way of said fourth switch, for converting charge from said second capacitor to voltage; and a clock signal generator circuit for generating clock signals for selectively driving said first and second switch devices, in synchronism with said bit data of said input digital data serially transmitted in an order from LSB thereof;

wherein said clock signal generator circuit generates said clock signals in a manner such that said first capacitor is charged by said voltage source by way of said first switch or said second switch in accordance with a logical level of said bit data of said input digital data serially transmitted in said order from LSB thereof, said distribution of charge between said first and second capacitors takes place through turning-on of said said third switch at a time point between two adjacent charging operations of said first capacitor corresponding to two adjacent ones of said bit data, said charging and said distribution of charge being repeated until after MSB of said input digital data is input to said D/A converter, and said charge from said second capacitor is converted to voltage by said charge-to-voltage converter circuit.

8. A D/A converter as claimed in claim 7, wherein said first to fourth switches are CMOS transfer gates.

9. A D/A converter as claimed in claim 7, including a sample-and-hold circuit connected to said charge-to-voltage-converter circuit, for sampling and holding output data from said charge-to-voltage converter circuit.

* * * * *